US012650652B2

(12) United States Patent (10) Patent No.: US 12,650,652 B2

Bae et al. (45) Date of Patent: Jun. 9, 2026

(54) MASK EXPOSURE SYSTEM AND MASK EXPOSURE METHOD

(71) Applicant: Samsung Electronics Co., Ltd., Suwon-si (KR)

(72) Inventors: Sukjong Bae, Suwon-si (KR); Kangho Park, Suwon-si (KR); Moongu Shin, Suwon-si (KR); Myoungsoo Lee, Suwon-si (KR); Hojune Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 423 days.

(21) Appl. No.: 18/354,207

(22) Filed: Jul. 18, 2023

(65) Prior Publication Data

US 2024/0152062 A1 May 9, 2024

(30) Foreign Application Priority Data

Nov. 8, 2022 (KR) ........................ 10-2022-0147464

(51) Int. Cl.
G03F 7/00 (2006.01)
G03F 7/20 (2006.01)

(52) U.S. Cl.
CPC .......... G03F 7/7085 (2013.01); G03F 7/2004 (2013.01); G03F 7/70075 (2013.01); G03F 7/70716 (2013.01); G03F 7/70758 (2013.01); G03F 7/70825 (2013.01)

(58) Field of Classification Search
CPC .............. G03F 7/70716; G03F 7/2004; G03F 7/70075; G03F 7/70758; G03F 7/70825; G03F 7/7085
See application file for complete search history.

(56) References Cited

U.S. PATENT DOCUMENTS

| | | | |
|---|---|---|---|
| 5,581,324 A | 12/1996 | Miyai et al. | |
| 5,894,056 A | 4/1999 | Kakizaki et al. | |
| 5,912,096 A | 6/1999 | Hada | |
| 6,424,879 B1 | 7/2002 | Trost et al. | |
| 6,456,953 B1 | 9/2002 | Peruffo et al. | |
| 9,645,502 B2 * | 5/2017 | De Jager ............. | G03F 7/70191 |

(Continued)

FOREIGN PATENT DOCUMENTS

| | | |
|---|---|---|
| JP | 2000208390 A | 7/2000 |
| JP | 5414288 B2 | 11/2013 |

(Continued)

*Primary Examiner* — Amanda C. Walke

(74) *Attorney, Agent, or Firm* — Wolf, Greenfield & Sacks, P.C.

(57) ABSTRACT

A mask exposure system includes a chamber, a stage configured to receive a mask, one or more mask temperature sensors, a beam source configured to irradiate an electron beam on the mask, a deflector configured to adjust a position at which the electron beam is irradiated on the mask by deflecting the electron beam based on a voltage level applied to the deflector, in the chamber, a chamber temperature sensor configured to measure an internal temperature of the chamber, and a controller configured to control a direction of deflection and a degree of deflection of the electron beam the deflector. The controller is configured to correct the voltage level applied to the deflector based on a difference between the temperature of the mask and the chamber.

20 Claims, 14 Drawing Sheets

(56)         References Cited

U.S. PATENT DOCUMENTS

| | | | |
|---|---|---|---|
| 10,012,900 | B2 | 7/2018 | Kim et al. |
| 10,056,229 | B2 * | 8/2018 | Bae ..................... H01J 37/3174 |
| 10,665,422 | B2 * | 5/2020 | Takekoshi .............. G06T 7/001 |
| 12,298,671 | B2 * | 5/2025 | Kim .................... G03F 7/70075 |
| 2007/0158576 | A1 | 7/2007 | Kamikubo et al. |
| 2014/0077078 | A1 * | 3/2014 | Hatakeyama ...... G01N 23/2251 |
| | | | 250/310 |
| 2020/0395191 | A1 * | 12/2020 | Hashimoto ........... H01J 37/244 |
| 2024/0219826 | A1 * | 7/2024 | Hwang ................. G01Q 80/00 |

FOREIGN PATENT DOCUMENTS

| | | | |
|---|---|---|---|
| KR | 1020040081619 | A | 9/2004 |
| KR | 100555467 | B1 | 3/2006 |
| KR | 10-2017-0035207 | A | 3/2017 |

* cited by examiner

|  | λ | κ |
|---|---|---|
| Mask Type. 1 | α | κ1 |
| Mask Type. 2 | β | κ2 |
| Mask Type. 3 | γ | κ3 |

FIG. 8

MASK EXPOSURE SYSTEM AND MASK EXPOSURE METHOD

CROSS-REFERENCE TO RELATED APPLICATION(S)

This application claims benefit of priority to Korean Patent Application No. 10-2022-0147464 filed on Nov. 8, 2022 in the Korean Intellectual Property Office, the disclosure of which is incorporated herein by reference in its entirety.

BACKGROUND

The present disclosure relates to a mask exposure system and a mask exposure method.

Recently, the precision of a pattern required for a photomask for a semiconductor device has been increasing by a design rule. Positional accuracy of a pattern on a mask is a very important quality factor directly related to the overlay quality of a wafer.

The mask may enter an exposure machine chamber from an exterior of the exposure machine chamber such that an exposure process is performed. A temperature of the mask entering the machine chamber from the exterior may be different from an internal temperature of the chamber. A constituent material of the mask may expand or contract depending on a temperature change, such that the mask may expand or contract until the temperature of the mask entering the chamber attains thermal equilibrium with the internal temperature of the chamber. When the exposure process is performed while the mask expands or contracts, a positional error of the exposed pattern may occur. When such an error is not corrected, the error may finally result in a wafer defect.

SUMMARY

An aspect of the present disclosure provides a mask exposure system and a mask exposure method capable of correcting a mask placement error that may occur due to a difference between a temperature of a mask and an internal temperature of a chamber.

According to an aspect of the present disclosure, there is provided a mask exposure system including a chamber, a stage configured to receive a mask, one or more mask temperature sensors on the stage, the one or more mask temperature sensors being configured to measure a temperature of the mask, a beam source configured to irradiate an electron beam on a surface of the mask in the chamber, a deflector configured to adjust a position at which the electron beam is irradiated on the mask by deflecting the electron beam based on a voltage level applied to the deflector, in the chamber, a chamber temperature sensor configured to measure an internal temperature of the chamber, and a controller configured to control a direction of deflection and a degree of deflection of the electron beam by controlling, based on design data of a pattern to be formed on the mask, the voltage level applied to the deflector. When the stage enters the chamber, the controller may be configured to receive the internal temperature of the chamber from the chamber temperature sensor, to receive the temperature of the mask from the one or more mask temperature sensors, and to correct the voltage level applied to the deflector based on a temperature difference between the temperature of the mask and the internal temperature of the chamber.

According to another aspect of the present disclosure, there is provided a mask exposure method including obtaining design data of patterns to be formed on a mask, moving a stage on which the mask is mounted to an internal space of a chamber, evacuating the chamber, measuring a temperature of the mask, measuring an internal temperature of the chamber, predicting the temperature of the mask over time based on a difference between the temperature of the mask and the internal temperature of the chamber, determining an amount of correction of a deflector over time based on the temperature of the mask over time and a starting position of an exposure process on the mask, determining a degree of deflection determined based on the amount of correction and positions of the patterns included in the design data, and exposing the patterns by irradiating an electron beam on the mask based on the corrected degree of deflection.

According to another aspect of the present disclosure, there is provided an electron beam correction method for exposing a mask, the electron beam correction method including measuring a temperature difference between the mask and an interior of a chamber having the mask, predicting a temperature change of the mask over time based on the temperature difference, predicting a degree of distortion of a position of the mask over time based on the temperature change of the mask over time and a position of a surface of the mask at which an exposure process starts, and determining, based on the degree of distortion over time, an amount of correction of the electron beam.

A mask exposure system and a mask exposure method according to an example embodiment of the present disclosure may correct a mask placement error that may occur due to a difference between a temperature of a mask entering a chamber and an internal temperature of the chamber.

The mask exposure system and the mask exposure method according to an example embodiment of the present disclosure may expose a pattern in an exact position of a mask even while the mask expands or contracts due to the difference between the temperature of the mask and the internal temperature of the chamber, thereby increasing the productivity of an exposure process.

The issues to be resolved by the present disclosure are not limited to the issue described above, and other issues not described will be clearly understood by those skilled in the art from the following description.

BRIEF DESCRIPTION OF DRAWINGS

The above and other aspects, features, and advantages of the present inventive concept will be more clearly understood from the following detailed description, taken in conjunction with the accompanying drawings, in which:

FIG. 8 is a table illustrating parameters of a temperature behavior function and a function of a degree of position distortion depending on a mask type;

DETAILED DESCRIPTION

Hereinafter, example embodiments of the present disclosure will be described with reference to the accompanying drawings.

Figure 1:
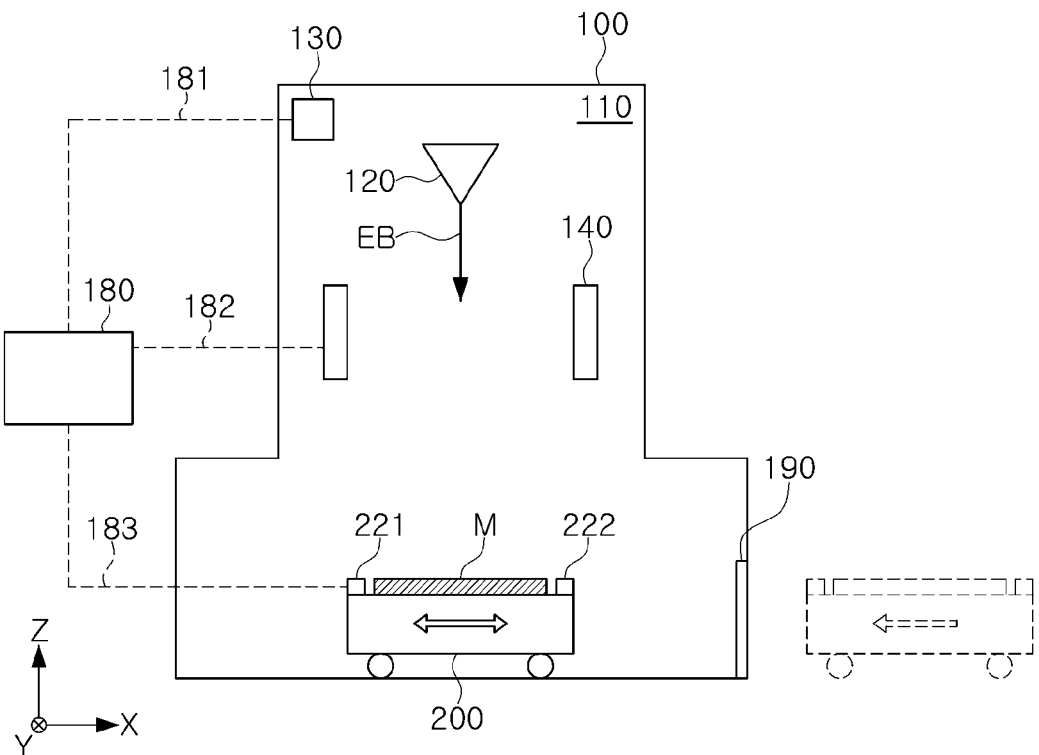
FIG. 1 is a schematic diagram illustrating an exposure system according to an example embodiment of the present disclosure.

FIG. 1 is a schematic diagram illustrating an exposure system 1 according to an example embodiment of the present disclosure.

Referring to FIG. 1, the exposure system 1 may include a chamber 100, a beam source 120, a chamber temperature sensor 130, a deflector 140, a controller 180, a chamber inlet 190, a stage 200, and mask temperature sensors 221 and 222. The exposure system 1 may perform an exposure process on a sample M by irradiating a charged particle beam EB onto the sample M. Hereinafter, an example in which the sample M is a mask, and the charged particle beam EB is an electron beam (e-beam) is described. However, types of a sample and a charged particle beam are not limited thereto.

The chamber 100 may provide an internal space 110 in which an exposure process is performed. A vacuum pump may be provided in the chamber 100, such that the internal space 110 may be maintained in a vacuum state. As illustrated in FIG. 1, the beam source 120, the chamber temperature sensor 130, and the deflector 140 may be in the internal space 110, and the controller 180 may be outside of the chamber 100. However, the present disclosure does not exclude a case in which the controller 180 is in the internal space 110. In addition, FIG. 1 illustrates that the exposure system 1 has a single chamber 100, but the present disclosure is not limited thereto, and the exposure system 1 may have a plurality of chambers.

The stage 200 may be configured to receive a mask M and to transfer or move the mask M. Specifically, the stage 200 having the mask M mounted on an upper surface thereof may move from the outside of the chamber 100 to the internal space 110 through the chamber inlet 190. An exposure process may be performed on the mask M after the mask M is moved to the internal space 110 by the stage 200.

The beam source 120 may irradiate an electron beam EB on the mask M mounted on the stage 200. A voltage may be applied to the deflector 140 to form an electric field affecting the electron beam EB. The electron beam EB may be deflected in a specific direction by an electric field applied to the deflector 140 while passing through the deflector 140. A position at which the electron beam EB is irradiated on a surface of the mask M may be determined depending on a degree of deflection of the electron beam EB. A degree of deflection of the electron beam EB may be determined based on a level of the voltage applied to the deflector 140. In order to adjust the position at which the electron beam EB is irradiated on the surface of the mask M, the stage 200 may also move on an X-Y plane and, and may move along a Z-axis, if necessary.

The deflector 140 may include metal. The deflector 140 may be positioned and configured to surround or partially surround an electron beam pathway (e.g., a space in which the electron beam EB is irradiated). The deflector 140 illustrated in FIG. 1 may be a cross section positioned on the X-Z plane, and only some components are illustrated. A principle in which the electron beam EB is deflected will be described below with reference to FIG. 2. In FIG. 1, only the deflector 140 is illustrated between the beam source 120 and the stage 200. However, the exposure system 1 may further include an aperture or a lens for controlling a direction of the electron beam EB, an aperture for adjusting an amount of the electron beam EB, and the like. In addition, a plurality of deflectors 140 may be positioned in or adjacent a direction of irradiation of the electron beam EB.

The chamber temperature sensor 130 may measure a temperature of the internal space 110. The temperature of the internal space 110 may affect the exposure quality of the mask M. The temperature of the internal space 110 may be controlled based on the temperature of the internal space 110 measured by the chamber temperature sensor 130.

The controller 180 may control the deflector 140 and the stage 200. The controller 180 may obtain design data including patterns to be exposed on the mask M. The controller 180 may control the deflector 140 and the stage 200 based on the design data to expose the patterns in a target position on the surface of the mask M. In addition, the controller 180 may control an irradiation timing and an irradiation position of the beam source 120. In addition, the controller 180 may control a cooler, a heater, and the like of an internal space such that a predetermined temperature of the internal space 110 is maintained, with reference to the temperature of the internal space 110 received from the chamber temperature sensor 130.

Figure 2:
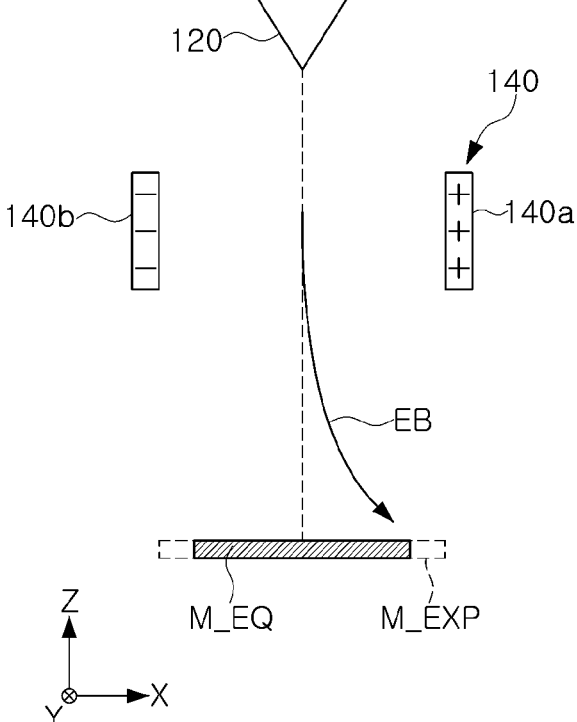
FIG. 2 is a diagram illustrating a principle in which an electron beam is deflected.

FIG. 2 is a diagram illustrating a principle in which an electron beam EB is deflected For clarity of description, FIG. 2 illustrates a size and a ratio in an exaggerated manner. Referring to FIGS. 1 and 2, first and second deflection plates 140a and 140b opposing each other may be positioned on an X-Z plane. The beam source 120 may irradiate the electron beam EB to be perpendicular to the mask M, but the electron beam EB may be deflected by electric fields applied to the first and second deflection plates 140a and 140b. For example, when a positive voltage is applied to the first deflection plate 140a and a negative voltage is applied to the second deflection plate 140b, the electron beam EB may be deflected toward the first deflection plate 140a. Depending on directions and/or intensities of the voltages applied to the first and second deflection plates 140a and 140b, a direction of deflection and a degree of deflection of the electron beam EB may be adjusted.

The mask M may include a quartz substrate. The quartz substrate may expand or contract depending on temperature. For example, the quartz substrate may isotropically expand with an increase in temperature of the quartz substrate, and the quartz substrate may isotropically contract with a reduction in temperature of the quartz substrate.

In order to perform an exposure process, the mask M may enter the internal space 110 from the outside of the chamber 100. An external temperature and an internal temperature of the chamber 100 may be different from each other. Accordingly, a temperature of the mask M immediately after the mask M enters the chamber 100 may be different from the internal temperature of the chamber 100.

When time elapses after the mask M enters the chamber 100, the temperature of the mask M may attain thermal equilibrium with a temperature of the internal space 110. The temperature of the mask M may vary over time until the temperature of the mask M attains thermal equilibrium with the temperature of the internal space 110. Accordingly, the mask M may expand or contract until the temperature of the mask M attains thermal equilibrium with the temperature of the internal space 110.

FIG. 2 illustrates relative sizes of mask in a first state M_EXP immediately after the mask M enters the chamber 100 and a second state M_EQ after the mask M attains thermal equilibrium with the chamber 100. For example, when the external temperature of the chamber 100 is higher than the internal temperature of the chamber 100, the mask in the first state M_EXP may be in an expanded state, as compared to the mask in the second state M_EQ.

When the sizes of the mask in the first state M_EXP and the second state M_EQ are different from each other, relative positions where a pattern is exposed on a surface of the mask M in the first state and the second state may vary even when absolute positions of the internal space 110 at which the electron beam EB is irradiated in the first state and the second state are the same. Accordingly, when the exposure process is performed before the mask M and the internal space 110 attain thermal equilibrium, a mask placement error in which the pattern is exposed on the surface of the mask M in a position different from a target position of the pattern may occur.

Figure 3:
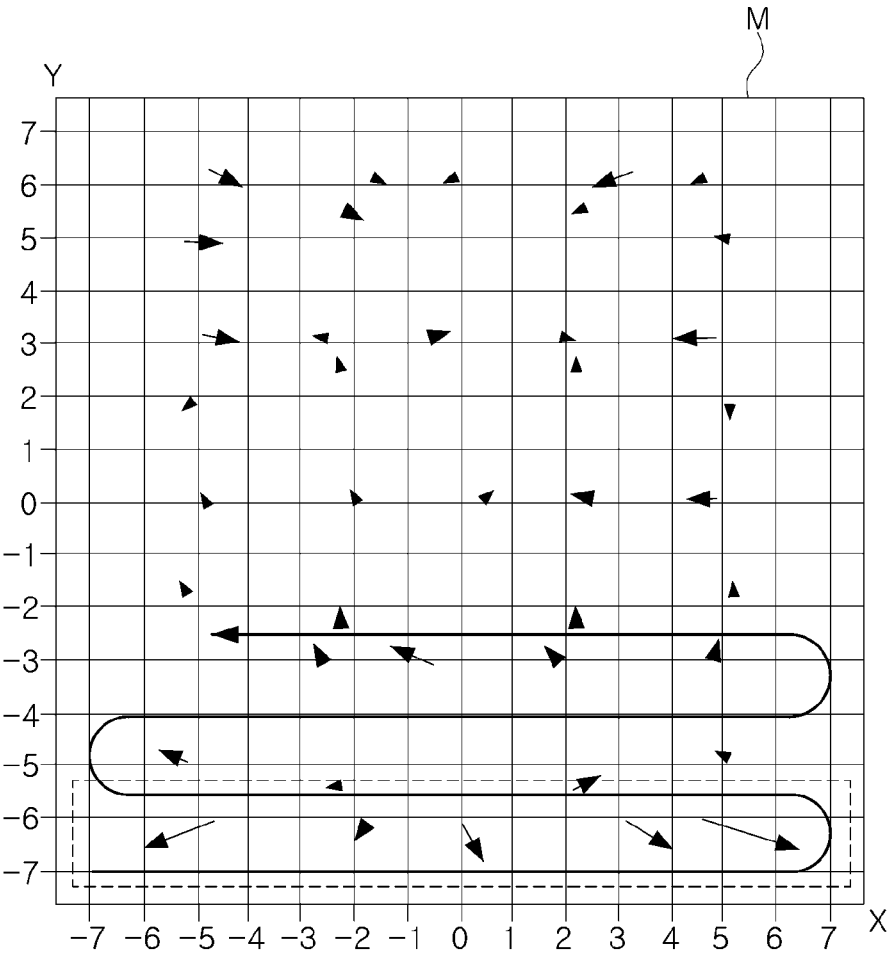
FIG. 3 is a diagram illustrating a registration map of the mask illustrated in FIG. 1.

FIG. 3 is a diagram illustrating a registration map of the mask M of FIG. 1.

The registration map of FIG. 3 illustrates a position of a pattern on a surface of the mask M, in an X-Y plane. A straight arrow illustrated in the registration map of FIG. 3 may represent an error vector corresponding to a difference between target positions of patterns included in design data and actual positions of patterns exposed on the mask M.

The patterns included in the design data may be sequentially exposed depending on a direction of deflection of the electron beam B and a direction of movement of the stage 200. A curved arrow illustrated in the registration map of FIG. 3 may represent an order in which the patterns are exposed. For example, the patterns may be exposed in a +Y-direction. Each position on a Y-axis may be sequentially exposed in an +X-direction or an –X-direction. For example, when the patterns are exposed in the +X-direction in the vicinity of a "–7" position on the Y-axis, and the exposure in the vicinity of the "–7" position is completed, an exposure process may be performed in a manner of the patterns being exposed in the –X-direction in the vicinity of a "–5.5" position on the Y-axis.

The greater a difference between the temperature of the mask M and the temperature of the internal space 110, the greater the difference between the target positions and the actual positions of the patterns. The temperature difference may be greatest immediately after the mask M enters the internal space 110, and the temperature difference may gradually decrease over time. Accordingly, a mask placement error in a position exposed first on the mask M may be significant. In the example of FIG. 3, sizes of error vectors in a region represented by a broken line may be larger than sizes of error vectors in the other regions. The region represented by the broken line may correspond to the earlier exposed positions when the temperature difference between the mask M and the internal space 110 is the largest.

When the exposure process is performed after waiting until the mask M and the internal space 110 attain thermal equilibrium, the mask placement error may be alleviated. However, the productivity of the exposure process may be reduced due to the waiting time.

According to an example embodiment of the present disclosure, the controller 180 may predict a degree of position distortion over time based on a temperature change of the mask M over time, and may correct or determine a degree of deflection of the deflector 140 such that a position of a pattern exposed on a mask corresponds to a target position.

Referring back to FIG. 1, the mask temperature sensors 221 and 222 may measure the temperature of the mask M. The controller 180 may receive the temperature of the internal space 110 from the chamber temperature sensor 130, and may receive the temperature of the mask M from the mask temperature sensors 221 and 222. Then, the controller 180 may predict the temperature change of the mask M depending on the difference between the temperature of the internal space 110 and the temperature of the mask M, and may predict the distortion of a pattern position depending on the temperature change. The controller 180 may correct or determine the degree of deflection determined based on the design data such that the distortion of the pattern position is offset. In addition, the controller 180 may control the deflector 140 to deflect the electron beam EB depending on the corrected degree of deflection.

The controller 180, the chamber temperature sensor 130, the deflector 140, and the mask temperature sensors 221 and 222 may perform wired or wireless data communication. In particular, the mask temperature sensors 221 and 222 may provide temperature information of the mask M to the controller 180 through wireless communication. FIG. 1 illustrates communication paths 181 to 183 of the controller 180, the chamber temperature sensor 130, the deflector 140, and the mask temperature sensors 221 and 222.

According to an example embodiment of the present disclosure, patterns may be exposed in a target position of the mask M even while the mask M expands or contracts due to the temperature change of the mask M over time, thereby improving the quality of the mask M. In addition, the exposure process may be performed without waiting until the mask M attains thermal equilibrium with the internal space 110, thereby improving the productivity of the exposure process.

Hereinafter, example embodiments of the present disclosure will be described in detail with reference to FIGS. 4 to 11.

Figure 4:
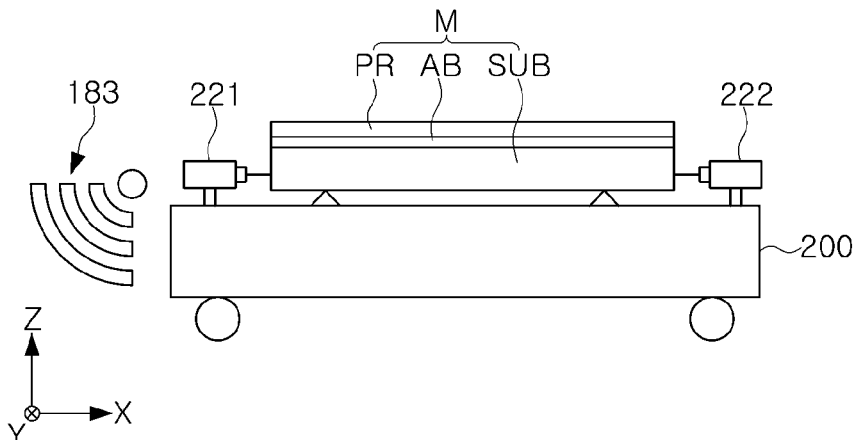
FIG. 4 is an enlarged view of a portion of a mask exposure system according to an example embodiment of the present disclosure.

FIG. 4 is an enlarged view of a portion of a mask exposure system according to an example embodiment of the present disclosure. Specifically, FIG. 4 illustrates the stage 200, the mask temperature sensors 221 and 222, and the mask M illustrated in FIG. 1 in detail.

The mask M may include a mask substrate SUB, an absorber AB, and a resist PR. The mask substrate SUB may be a transparent substrate, a reflective substrate, or an absorbing substrate. For example, the mask substrate SUB may include quartz. The absorber AB may include a metal film such as chromium. The resist PR may be exposed by the electron beam EB to have a photosensitive pattern.

The mask temperature sensors 221 and 222 may be on a surface of the stage 200 on which the mask M is mounted. According to an example embodiment of the present disclosure, the mask temperature sensors 221 and 222 may include a non-contact temperature sensor, for example, an infrared temperature sensor.

The mask temperature sensors 221 and 222 may measure a temperature of a side surface of the mask substrate SUB on a side surface of the mask M. The side surface of the mask substrate SUB may have a thickness sufficient to be measured using the infrared temperature sensor. For example, the mask substrate SUB may have a thickness of about 6.35 mm.

The mask temperature sensors 221 and 222 may prevent infrared energy output from the mask temperature sensors 221 and 222 from being absorbed by the resist PR on an upper surface of the mask M by measuring the temperature of the side surface of the mask substrate SUB, thereby preventing an error caused by temperature measurement from occurring in a pattern exposed to the resist PR.

A temperature of the mask M measured by the mask temperature sensors 221 and 222 may be transmitted to the controller 180 using wireless communication 183. According to an example embodiment of the present disclosure, the stage 200 on which the mask temperature sensors 221 and 222 are mounted may not receive mechanical stress such as tension caused by wired connection. Thus, driving of the stage 200 may be smoothly controlled in an exposure process.

FIG. 4 illustrates a case in which two mask temperature sensors 221 and 222 are on a surface of the stage 200, but the present disclosure is not limited thereto. Various numbers of mask temperature sensors may be on the surface of the stage 200 in various patterns and configurations.

FIGS. 5A to 5D are diagrams illustrating an upper surface of a stage according to an example embodiment of the present disclosure.

Figure 5A:
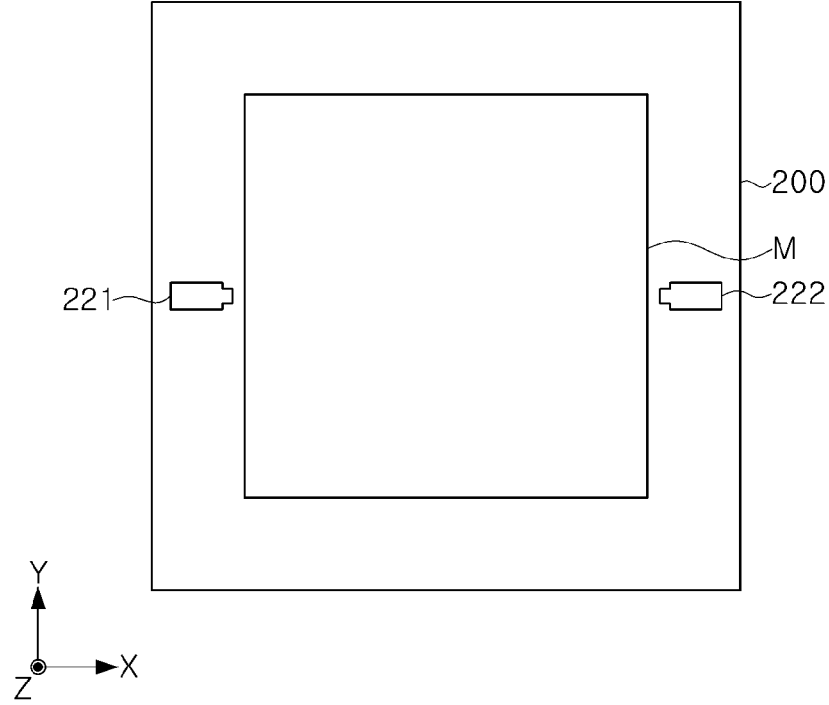
FIGS. 5A to 5D are diagrams illustrating an upper surface of a stage according to an example embodiment of the present disclosure.

FIG. 5A is a diagram illustrating the stage 200, the mask temperature sensors 221 and 222, and the mask M illustrated in FIG. 4 in an X-Y plane. In the example of FIG. 5A, the two mask temperature sensors 221 and 222 may respectively measure temperatures of two sides surfaces of the mask M, parallel to a Y-Z plane. Two temperature values respectively measured by the mask temperature sensors 221 and 222 may be transmitted to the controller 180. The controller 180 may determine a temperature of the mask M in a manner of calculating an average value of the two temperature values.

Figure 5B:
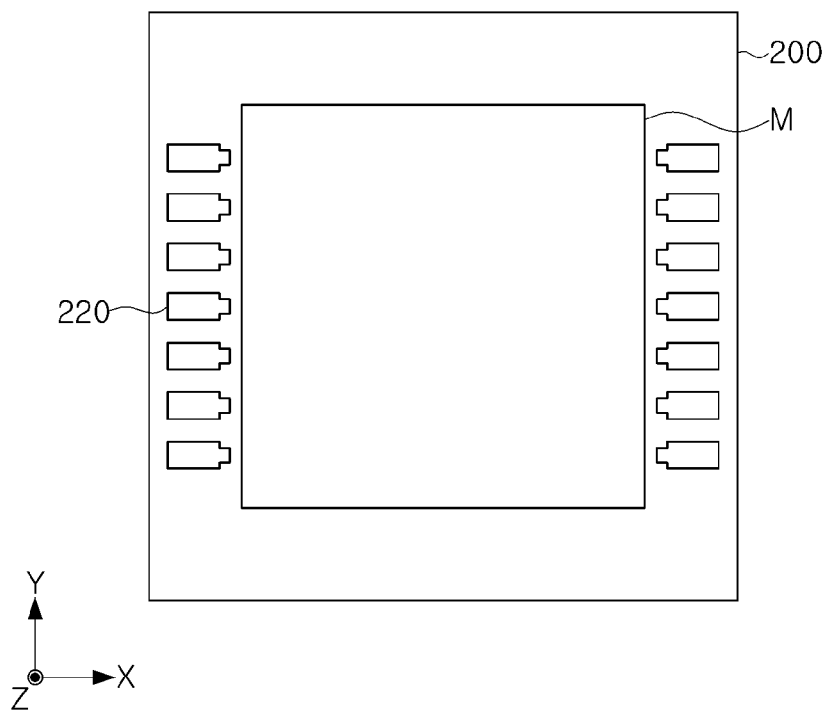
Figure 5C:
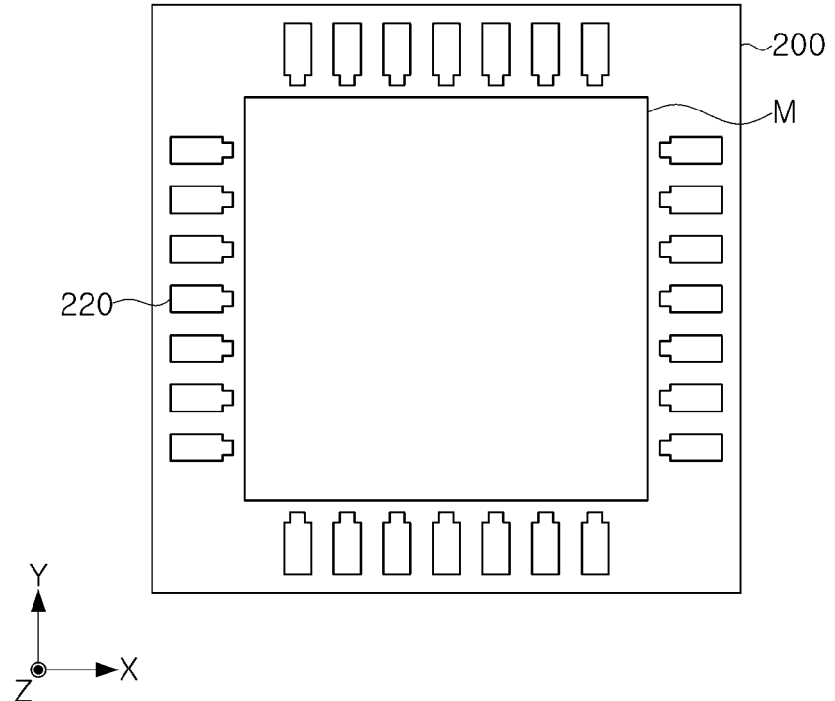
Figure 5D:
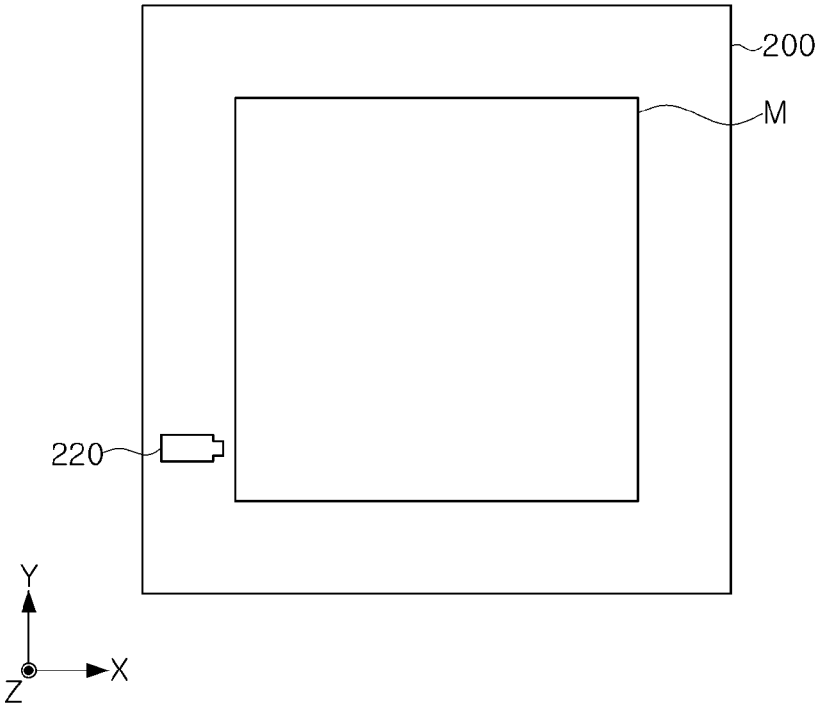

FIGS. 5B to 5D are diagrams illustrating the stage 200, the mask temperature sensors 220 and the mask M in an X-Y plane. Each of the mask temperature sensors 220 of FIGS. 5B to 5D may have a structure the same as that of each of the mask temperature sensors 221 and 222 of FIG. 5A.

Referring to FIG. 5B, the mask temperature sensors 220 may be adjacent to the mask M in an −X-direction and an +X-direction, and may be arranged in a Y-direction. Multiple temperature values measured by the mask temperature sensors 220 may be transmitted to the controller 180. The controller 180 may more accurately determine a temperature of the mask M using the multiple temperature values.

Referring to FIG. 5C, the mask temperature sensors 220 may include temperature sensors adjacent to the mask M in the −X-direction and the +X-direction, the temperature sensors arranged in the Y-direction, and temperature sensors adjacent to the mask M in a −Y-direction and a +Y-direction, the temperature sensors arranged in an X-direction. In the example of FIG. 5C, the controller 180 may receive multiple temperature values for four side surfaces of the mask M, and may more accurately determine a temperature of the mask M using the received temperature values.

Referring to FIG. 5D, only one mask temperature sensor 220 may be on the stage 200. The mask temperature sensor 220 may also be on any side surface of the mask M. Depending on the implementation, the mask temperature sensor 220 may be adjacent to an exposure initiation position of the mask M, thereby measuring a temperature of the mask M in the vicinity of the exposure initiation position. A degree of deflection of the electron beam EB at a point in time of starting an exposure process may be more accurately corrected or determined based on the temperature measured in the vicinity of the starting position.

Figure 6:
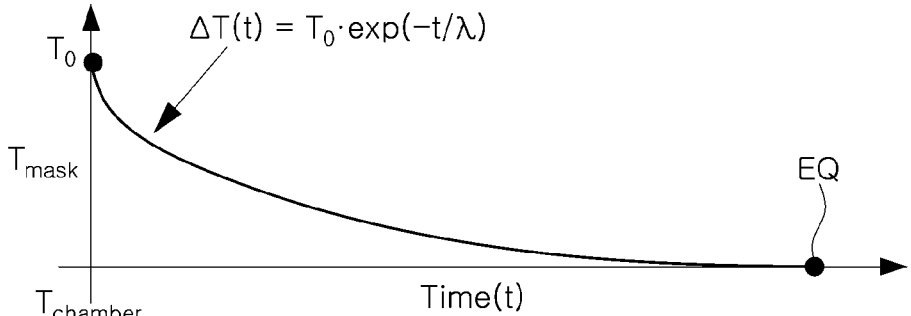
FIG. 6 is a graph illustrating a temperature behavior function of a mask over time.

FIG. 6 is a graph illustrating a temperature behavior function of a mask over time.

In the graph of FIG. 6, a horizontal axis may represent time, and a vertical axis may represent a mask temperature (Tmask) with respect to a chamber internal temperature (Tchamber). That is, the vertical axis may represent a temperature difference between the mask temperature (Tmask) and the chamber internal temperature (Tchamber). The temperature difference may have an initial value (TO). The mask temperature (Tmask) may gradually become closer to the chamber internal temperature (Tchamber) over time, and may reach a thermal equilibrium state (EQ) in which the mask temperature (Tmask) is equal to the chamber internal temperature (Tchamber).

A behavior function of the difference between the mask temperature (Tmask) and the chamber internal temperature (Tchamber) over time may be represented by [Equation 1] below.

$$\Delta T(t) = T_0 * \exp(-t/\lambda) \qquad \text{[Equation 1]}$$

Here, $\Delta T(t)$ may represent the temperature difference between the mask temperature (Tmask) and the chamber internal temperature (Tchamber) over time, TO may represent an initial value of the temperature difference, and $\lambda$, may represent a predetermined constant.

When the controller 180 maintains the chamber internal temperature (Tchamber), the mask temperature (Tmask) may change over time while the mask M and the internal space 110 reach the thermal equilibrium state (EQ). While the mask temperature (Tmask) changes, the mask M may expand or contract. Accordingly, until the thermal equilibrium state (EQ) is reached, a degree of distortion of a position of a surface of the mask M may vary over time, and an amount of correction of a degree of deflection may need to vary over time.

Figure 7:
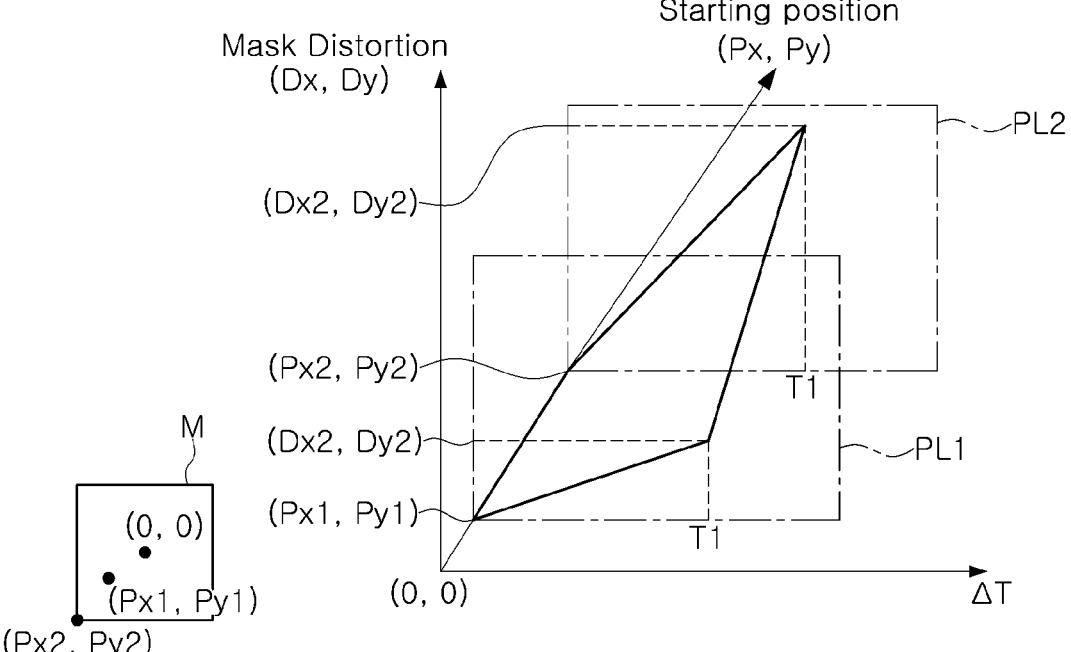
FIG. 7 is a graph illustrating a degree of position distortion of a mask surface depending on a temperature difference and an exposure initiation position of the mask surface.

FIG. 7 is a graph illustrating a degree of position distortion of a mask surface depending on a temperature difference and an exposure initiation position of the mask surface. Three axes illustrated in the graph of FIG. 7 may respectively represent a temperature difference ($\Delta T$) between a mask and an internal space, an exposure initiation position (Px, Py), and a degree of position distortion (Dx, Dy). The exposure initiation position (Px, Py) may represent how far a position at which an exposure process starts is from a central position (0, 0) of the mask M in an X-direction and a Y-direction. The degree of position distortion (Dx, Dy) may represent a degree to which an actual position to be exposed on the mask M is displaced in the X-direction and the Y-direction, as compared to a target position on a surface of the mask M.

In addition, the graph of FIG. 7 illustrates a first plane PL1 representing the degree of position distortion (Dx, Dy) depending on the temperature difference ($\Delta T$) when the exposure initiation position is (Px1, Py1), and a second plane PL2 representing the degree of position distortion (Dx, Dy) depending on the temperature difference ($\Delta T$) when the exposure initiation position is (Px2, Py2). The exposure initiation position (Px2, Py2) may represent a position farther from the center of the mask M than the exposure initiation position (Px1, Py1).

In the first plane PL1, the degree of position distortion (Dx, Dy) may increase as the temperature difference (ΔT) increases. For example, as the mask temperature (Tmask) is higher than the chamber internal temperature (Tchamber), the mask M may be in a more greatly expanded state. When a pattern is exposed in a target position without correcting a degree of deflection in a state in which the mask M is expanded, the pattern may be exposed in a position closer to the center of the mask M than the target position.

Similarly, in the second plane PL2, the degree of position distortion (Dx, Dy) may increase as the temperature difference (ΔT) increases. When compared to the first plane PL1, a slope of the degree of mask distortion (Dx, Dy) depending on the temperature difference (ΔT) may increase in the second plane PL2. This is because when the mask M isotropically expands or contracts with respect to the center thereof, a degree of position distortion may increase as a distance from the center increases. For example, in the case of having the same temperature difference (T1), when an exposure process is started in the position (Px1, Py1), a degree of mask distortion may be (Dx1, Dy1), but when the exposure process is started in the position (Px2, Py2), the degree of mask distortion may be (Dx2, Dy2) greater than (Dx1, Dy1).

Accordingly, as the temperature difference (ΔT) increases and the exposure process starting positions (Px, Py) are further away from the center of the mask M, the degree of position distortion (Dx, Dy) may increase.

A degree of distortion of an exposure position depending on a temperature difference and an exposure initiation position of a mask surface may be modeled, as shown in [Equation 2] below.

$$D_x = \kappa \cdot P_x \cdot \Delta T, D_y = \kappa \cdot P_y \cdot \Delta T \qquad \text{[Equation 2]}$$

Here, Dx may represent a degree of mask distortion in an X-direction, Dy may represent a degree of mask distortion in a Y-direction, Px may represent an exposure initiation position in the X-direction, Py may represent an exposure initiation position in the Y-direction, and κ may represent a predetermined constant.

FIG. 7 and [Equation 2] illustrate a case in which the degree of position distortion (Dx, Dy) is modeled as a linear function for each of the temperature difference (ΔT) and the exposure initiation position (Px, Py). However, the present disclosure is not limited thereto, and the degree of mask distortion (Dx, Dy) may be modeled as a quadratic or higher order function for each of the temperature difference (ΔT) and the exposure initiation position (Px, Py).

FIG. 8 is a table illustrating parameters of a temperature behavior function and a function of a degree of position distortion depending on a mask type.

The mask type may be determined based on constituent materials of the absorber AB and the resist PR. Depending on a constituent material of a mask, a temperature behavior and a degree of expansion of the mask may vary. That is, values of parameters λ, and κ may vary depending on the mask type. The values of the parameters depending on the mask type may be predetermined. For example, the values of the parameters may be experimentally determined by a user, and may be input to the controller 180 by the user. The controller 180 may provide a user interface to receive parameter values from the user.

Figure 9:
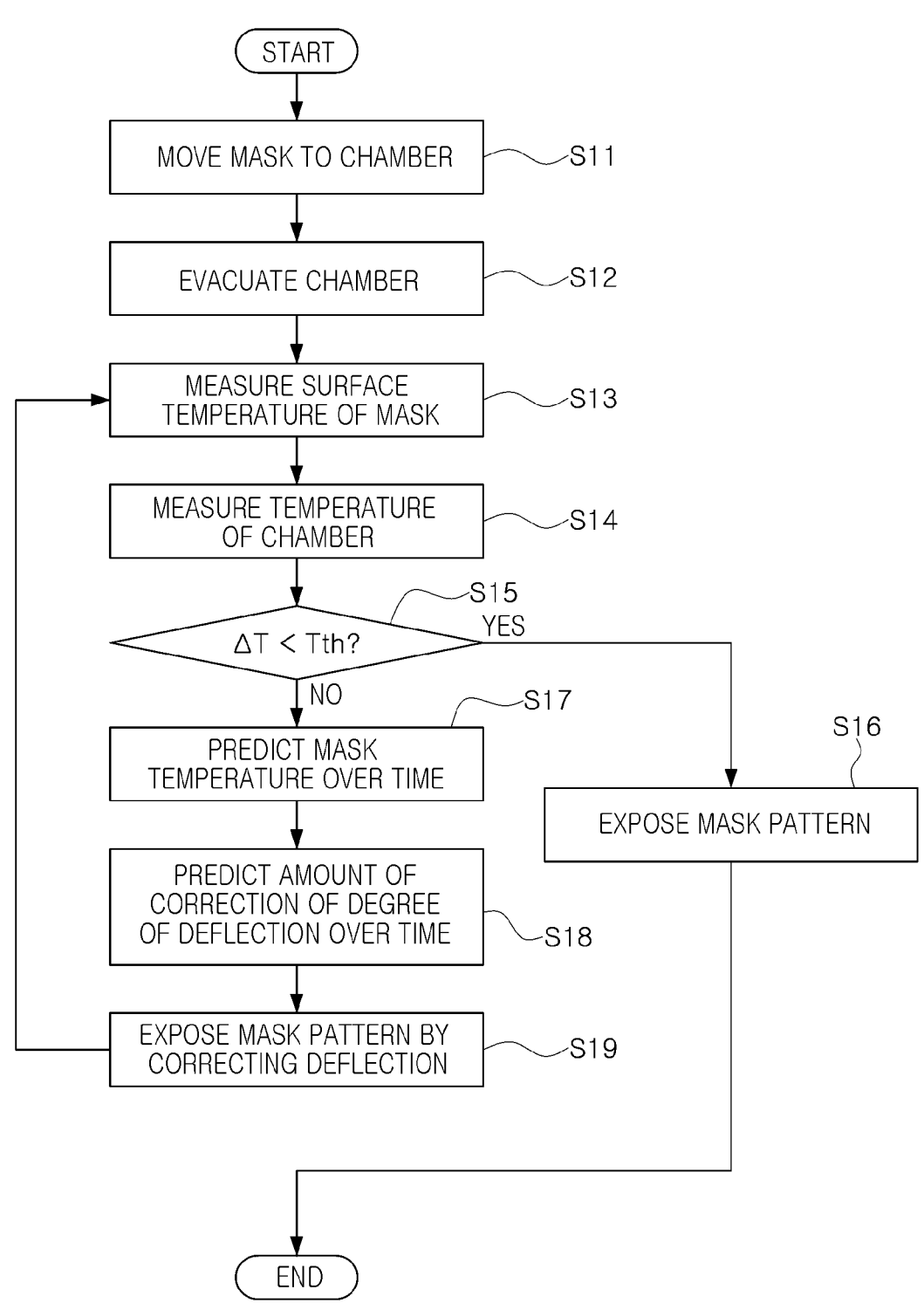
FIG. 9 is a flowchart illustrating a mask exposure method according to an example embodiment of the present disclosure.

FIG. 9 is a flowchart illustrating a mask exposure method according to an example embodiment of the present disclosure.

Referring to FIGS. 1 and 9 together, in operation S11, the mask M may be mounted on the stage 200 to enter the internal space 110 of the chamber 100 of an exposure machine.

In operation S12, the chamber 100 may evacuate the internal space 110 using a vacuum pump.

In operation S13, one or more mask temperature sensors 221 and 222 may measure a temperature of a mask. As described with reference to FIGS. 4 to 5D, one or more mask temperature sensors may measure a temperature of a side surface of a mask substrate as a temperature of a surface of the mask M.

In operation S14, the chamber temperature sensor 130 may measure a temperature of the internal space 110.

In operation S15, the controller 180 may determine whether a difference between the temperature of the internal space 110 and the temperature of the mask M has a value less than a threshold value.

When the temperature difference has a value less than the threshold value ("Yes" in operation S15), the controller 180 may directly expose a mask pattern without performing correction of a pattern position based on the expansion or contraction of the mask M depending on a temperature change in operation S16.

When the temperature difference has a value greater than or equal to the threshold value ("No" in operation S15), the controller 180 may predict a temperature change of the mask over time in operation S17. Specifically, the controller 180 may predict a temperature of the mask over time with reference to a behavior function of the temperature difference over time, as described with reference to FIG. 6.

In operation S18, the controller 180 may determine an amount of correction of a degree of deflection of the deflector 140 depending on time. Specifically, the controller 180 may determine a degree of position distortion of the mask M based on a temperature change of a mask over time and an exposure initiation point, and may determine the amount of correction of the degree of deflection over time depending on the degree of position distortion.

In operation S19, the deflector 140 may expose a mask pattern in a target position by deflecting the electron beam EB depending on the corrected degree of deflection.

Specifically, the controller 180 may determine a direction of deflection and a degree of deflection of the electron beam EB depending on position information of patterns included in design data. In addition, the controller 180 may correct the degree of deflection of the electron beam EB by applying, to the degree of deflection, the amount of correction depending on time. In addition, the controller 180 may apply, to the deflector 140, a voltage having a voltage level corrected based on the corrected degree of deflection. The deflector 140 may expose patterns in corrected positions by deflecting the electron beam EB depending on the applied voltage.

Operations S13 to S19 may be repeatedly performed until an exposure process is completed. The controller 180 may periodically receive a mask temperature and an internal temperature of a chamber, and may correct the prediction of the temperature change of the mask over time. A temperature behavior function generated by the controller 180 correcting the predicted temperature change of the mask over time will be described in detail with reference to FIG. 10.

Figure 10:
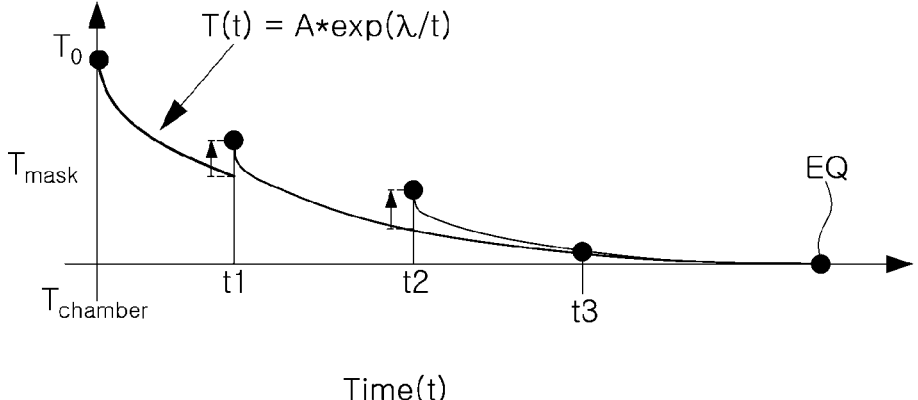
FIG. 10 is a graph illustrating a temperature behavior function of a mask over time.

FIG. 10 is a graph illustrating a temperature behavior function of a mask over time.

Referring to FIG. 10, at an initial point in time (t0) and first to third points in time (t1 to t3), a mask temperature and an internal temperature of a chamber may be measured, and a difference between the mask temperature and the internal temperature of the chamber may be determined.

For example, an initial value (Tmask0) of the temperature difference may be determined depending on a measurement result at the initial point in time (t0). From the initial point in time (t0) to a first point in time (t1), a mask temperature over time may be predicted based on the initial value (Tmask0).

As time elapses, a difference may occur between an actual mask temperature and a mask temperature predicted based on the initial value (Tmask0). For example, the electron beam EB may be incident on a mask surface when an exposure process is performed, the actual mask temperature may be higher than the predicted mask temperature due to incident energy of the electron beam EB. Accordingly, when the difference between the mask temperature and the internal temperature of the chamber is periodically updated, the mask temperature over time may be more accurately predicted.

For example, a mask temperature measured at the first point in time (t1) may be higher than the predicted mask temperature. A behavior function for predicting the mask temperature may be modified based on the mask temperature measured at the first point in time (t1). Similarly, at the second and third points in time t2 and t3, the behavior function may be modified based on the measured temperature value of the mask.

Predicting the temperature of the mask by periodically updating the difference between the mask temperature and the internal temperature of the chamber may be performed until the mask and the internal space of the chamber reach thermal equilibrium (EQ).

FIGS. 11A to 11E are graphs illustrating an effect of a mask exposure method according to an example embodiment of the present disclosure.

Figures 11A, 11B, 11C, 11D, 11E:
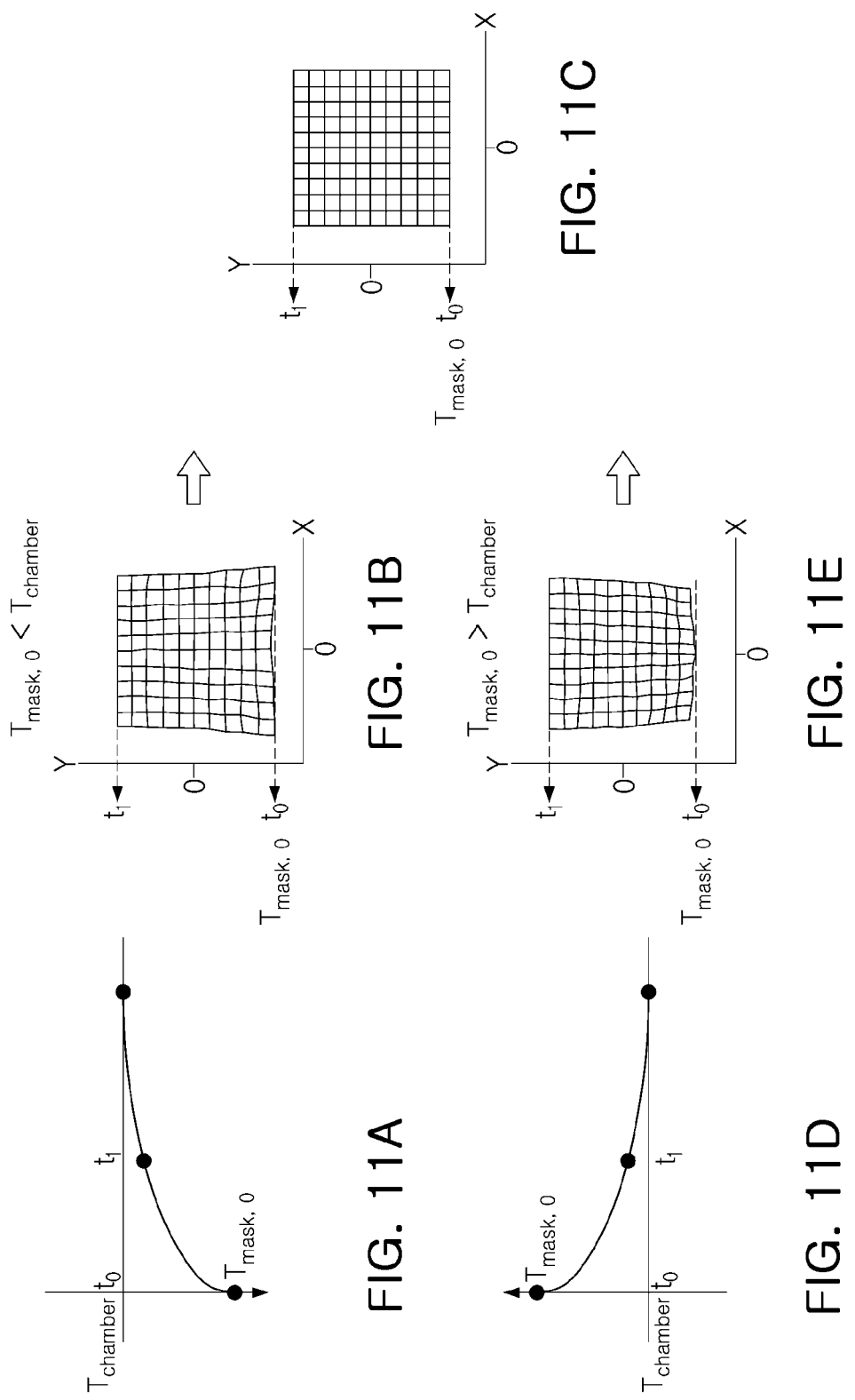
FIGS. 11A to 11E are graphs illustrating an effect of a mask exposure method according to an example embodiment of the present disclosure.

FIG. 11A illustrates a behavior function of a mask temperature when an initial value (Tmask0) of the mask temperature is less than a value of a temperature of a chamber. FIG. 11B illustrates a registration map of the mask when the mask temperature has a behavior function the same as that of FIG. 11A. As described with reference to FIG. 3, an exposure process for the mask may be performed in a +Y-direction. Referring to FIG. 11B, the exposure process may be performed from an initial point in time (t0) to a first point in time (t1). FIG. 11B illustrates a position exposed at the initial point in time (t0) and a position exposed at the first point in time (t1).

Referring to FIG. 11A, a temperature of a mask may gradually increase over time, such that the temperature of the mask may become equal to an internal temperature of the chamber. At the initial point in time (t0) at which the temperature is the lowest, the mask may be in a contracted state, and the mask may gradually expand over time. At the first point in time (t1), the mask may have a size close to an ideal size.

Referring to FIG. 11B, the mask may be in a contracted state at the initial point in time (t0). Thus, when the exposure process is performed without correcting a degree of deflection of the electron beam EB, patterns may be formed outward with respect to a target position. The registration map may be distorted in enlarged form in a −Y-direction. In the registration map, the distortion may be alleviated in the +Y-direction. In a position exposed at the first point in time (t1), the patterns may be formed in a position close to the target position.

According to an example embodiment of the present disclosure, when the mask is contracted because an initial value of the mask temperature is less than a value the temperature of the chamber, a degree of deflection of the electron beam EB may be corrected such that an inward position is exposed on a surface of the mask M with respect to the target position. FIG. 11C illustrates a registration map of the mask that may be formed when the degree of deflection of the electron beam EB is corrected according to an example embodiment of the present disclosure. When the degree of deflection of the electron beam EB is corrected depending on a temperature change, the patterns may be exposed in the target position regardless of the temperature change of the mask, such that the registration map may have an ideal form.

FIG. 11D illustrates a behavior function of the mask temperature when the initial value (Tmask0) of the mask temperature is greater than a value of the temperature of the chamber. FIG. 11E illustrates a registration map of a mask when the mask temperature has a behavior function the same as that of FIG. 11D.

Referring to FIG. 11D, the temperature of the mask may gradually decrease over time to reach a temperature the same as the internal temperature of the chamber. At the initial point in time (t0) at which the temperature is the highest, the mask may be in an expanded state. The mask may be gradually contracted over time. At the point in time (t1), the mask may have a size similar to an ideal size.

Referring to FIG. 11E, the mask may be in an expanded state at the initial point in time (t0). Thus, when the exposure process is performed without correcting the degree of deflection of the electron beam EB, the patterns may be formed inward with respect to the target position. Accordingly, the registration map may be distorted in reduced form in the −Y-direction. In the registration map, the distortion may be alleviated in the +Y-direction. In the position exposed at the first point in time (t1), the patterns may be formed in a position close to the target position.

When the mask is expanded because the initial value of the mask temperature is greater than the value of the temperature of the chamber, the degree of deflection of the electron beam EB may be corrected such that an outward position is exposed with respect to the target position, thereby correcting position distortion of a pattern. When the deflection of the electron beam EB is corrected, the registration map may have an ideal form, as illustrated in FIG. 11C.

According to an example embodiment of the present disclosure, even when a mask expands or contracts over time due to a temperature difference between a temperature of the mask entering a chamber and an internal temperature of the chamber, a degree of deflection of the electron beam EB may be corrected, thereby accurately exposing patterns in a target position of the mask. In addition, an exposure process may be performed without waiting until an interior of the chamber and the mask reach thermal equilibrium, thereby improving the productivity of the exposure process.

While example embodiments have been shown and described above, it will be apparent to those skilled in the art that modifications and variations could be made without departing from the scope of the present disclosure as defined by the appended claims.

What is claimed is:

1. A mask exposure system comprising:
   a chamber;
   a stage configured to receive a mask;
   one or more mask temperature sensors on the stage, the one or more mask temperature sensors being configured to measure a temperature of the mask;

a beam source configured to irradiate an electron beam on a surface of the mask in the chamber;

a deflector configured to adjust a position at which the electron beam is irradiated on the mask by deflecting the electron beam based on a voltage level applied to the deflector, in the chamber;

a chamber temperature sensor configured to measure an internal temperature of the chamber; and a controller configured to control a direction of deflection and a degree of deflection of the electron beam by controlling, based on design data of a pattern to be formed on the mask, the voltage level applied to the deflector, wherein, when the stage enters the chamber, the controller is configured to:

receive the internal temperature of the chamber from the chamber temperature sensor;

receive the temperature of the mask from the one or more mask temperature sensors; and correct the voltage level applied to the deflector based on a temperature difference between the temperature of the mask and the internal temperature of the chamber.

2. The mask exposure system of claim 1, wherein the controller is configured to correct the voltage level applied to the deflector by:

predicting a temperature change of the mask over time based on the temperature difference;

predicting a degree of distortion of a position on the mask over time based on the temperature change of the mask over time and a starting position of an exposure process on the mask;

correcting a degree of deflection of the electron beam based on the degree of distortion over time; and correcting the voltage level based on the corrected degree of deflection.

3. The mask exposure system of claim 2, wherein the controller is configured to predict that the degree of distortion is a larger value as the temperature difference increases or as the starting position is farther from a center of the mask.

4. The mask exposure system of claim 2, wherein the controller is configured to:

periodically obtain the temperature of the mask and the internal temperature of the chamber; and periodically update the predicted temperature change of the mask over time.

5. The mask exposure system of claim 4, wherein the controller is configured to repeatedly update the prediction of the temperature change of the mask over time until the mask and an interior of the chamber reach thermal equilibrium.

6. The mask exposure system of claim 2, wherein the controller is configured to predict, based on the temperature difference and a predetermined temperature behavior function, the temperature change of the mask over time.

7. The mask exposure system of claim 6, wherein a parameter value of the predetermined temperature behavior function is determined depending on a mask type of the mask.

8. The mask exposure system of claim 7, wherein the mask includes a mask substrate, an absorber and a resist, and the mask type is based on constituent materials of the absorber and the resist.

9. The mask exposure system of claim 1, wherein the mask includes a mask substrate, an absorber and a resist, and the one or more mask temperature sensors are configured to measure a temperature of the mask substrate as the temperature of the mask.

10. The mask exposure system of claim 9, wherein the mask substrate includes quartz.

11. The mask exposure system of claim 1, wherein the one or more mask temperature sensors are configured to transmit the temperature of the mask to the controller using wireless communication.

12. The mask exposure system of claim 1, wherein the one or more mask temperature sensors are on a surface of the stage opposing the mask.

13. The mask exposure system of claim 12, wherein the one or more mask temperature sensors are on opposite side surfaces of the mask.

14. The mask exposure system of claim 1, wherein the one or more mask temperature sensors are non-contact infrared temperature sensors.

15. A mask exposure method comprising:

obtaining design data of patterns to be formed on a mask;

moving a stage on which the mask is mounted to an interior space of a chamber;

evacuating the chamber;

measuring a temperature of the mask;

measuring an internal temperature of the chamber;

predicting the temperature of the mask over time based on a difference between the temperature of the mask and the internal temperature of the chamber;

determining an amount of correction of a deflector over time based on the temperature of the mask over time and a starting position of an exposure process on the mask;

determining a degree of deflection based on the amount of correction and positions of the patterns included in the design data; and exposing the patterns by irradiating an electron beam on the mask based on the degree of deflection.

16. The mask exposure method of claim 15, wherein determining the degree of deflection includes correcting the degree of deflection such that the electron beam is irradiated outward with respect to the positions of the patterns included in the design data when the temperature of the mask is higher than the internal temperature of the chamber.

17. The mask exposure method of claim 15, wherein determining the degree of deflection includes correcting the degree of deflection such that the electron beam is irradiated toward a center of the mask with respect to the positions of the patterns included in the design data when the temperature of the mask is lower than the internal temperature of the chamber.

18. The mask exposure method of claim 15, wherein determining the amount of correction is terminated, when the difference between the temperature of the mask and the internal temperature of the chamber has a value less than a threshold value.

19. An electron beam correction method for exposing a mask, the electron beam correction method comprising:

measuring a temperature difference between the mask and an interior of a chamber having the mask;

predicting a temperature change of the mask over time based on the temperature difference;

predicting a degree of distortion of a position on the mask over time based on the temperature change of the mask over time and a position of a surface of the mask at which an exposure process starts; and determining an amount of correction of an electron beam based on the degree of distortion over time.

20. The electron beam correction method of claim 19, further comprising:

determining a direction of deflection and a degree of deflection of the electron beam based on design data of the mask; and correcting the degree of deflection based on the amount of correction.

* * * * *